United States Patent
Zhuo et al.

(10) Patent No.: US 9,154,079 B2
(45) Date of Patent: Oct. 6, 2015

(54) THRESHOLD TRACKING BIAS VOLTAGE FOR MIXERS

(71) Applicant: QUALCOMM Incorporated, San Diego, CA (US)

(72) Inventors: Wei Zhuo, San Diego, CA (US); Himanshu Khatri, Laguna Niguel, CA (US); Ojas M Choksi, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 13/659,700

(22) Filed: Oct. 24, 2012

(65) Prior Publication Data

US 2014/0111252 A1 Apr. 24, 2014

(51) Int. Cl.
G05F 1/10 (2006.01)
G11C 5/14 (2006.01)
H03D 7/12 (2006.01)
H03F 1/30 (2006.01)

(52) U.S. Cl.
CPC . *H03D 7/12* (2013.01); *H03F 1/301* (2013.01)

(58) Field of Classification Search
CPC .................................... G05F 1/10; G11C 5/14
USPC ......... 327/108–112, 530, 538, 541, 543, 545, 327/546, 560–563, 512–513, 83, 138, 262, 327/371, 378; 323/311–315; 455/127.1
See application file for complete search history.

(56) References Cited

U.S. PATENT DOCUMENTS

| 5,200,602 A | * | 4/1993 | Ikebe et al. ................. 250/201.6 |
| 5,706,240 A | * | 1/1998 | Fiocchi et al. ................. 365/226 |
| 5,990,711 A | * | 11/1999 | Sekimoto ....................... 327/112 |
| 6,496,056 B1 | * | 12/2002 | Shoji .............................. 327/543 |
| 7,254,379 B2 | * | 8/2007 | Xu et al. ........................ 455/296 |
| 7,471,107 B1 | | 12/2008 | Fortin et al. |

(Continued)

FOREIGN PATENT DOCUMENTS

JP 2006074380 A 3/2006

OTHER PUBLICATIONS

Den Besten, et al., "Embedded 5V-to-3.3V Voltage Regulator for Supplying Digital IC's in 3.3V CMOS Technology," IEEE Journal of Solid-State Circuits, vol. 33, No. 7, pp. 956-962, Jul. 1998.

(Continued)

*Primary Examiner* — Lincoln Donovan
*Assistant Examiner* — Thomas Skibinski
(74) *Attorney, Agent, or Firm* — Ramin Mobarhan

(57) ABSTRACT

Bias voltage generators that can generate variable bias voltages for transistors in mixers and other circuits are disclosed. In an exemplary design, an apparatus (e.g., a wireless device or an integrated circuit (IC)) includes at least one transistor and a bias voltage generator. The transistor(s) have a threshold voltage and receive a bias voltage. The bias voltage generator generates the bias voltage based on changes to the threshold voltage of the transistor(s), e.g., due to IC process and/or temperature. In an exemplary design, the bias voltage generator includes a replica transistor that tracks the transistor(s) and an op-amp that provides a gate voltage for the replica transistor. The bias voltage is generated based on the gate voltage. The bias voltage generator may generate the bias voltage (i) to track the threshold voltage of the transistor(s) in a first mode or (ii) based on a fixed voltage in a second mode.

20 Claims, 8 Drawing Sheets

(56) References Cited

U.S. PATENT DOCUMENTS

| | | | |
|---|---|---|---|
| 7,679,448 B1 | 3/2010 | McAdam et al. | |
| 7,898,332 B2 | 3/2011 | Deguchi et al. | |
| 7,952,937 B2 * | 5/2011 | Bode | 365/185.23 |
| 2002/0175735 A1 | 11/2002 | Aparin | |
| 2007/0152739 A1 * | 7/2007 | Banerjee et al. | 327/538 |
| 2007/0205812 A1 * | 9/2007 | Yamamoto et al. | 327/108 |
| 2008/0258779 A1 | 10/2008 | Wadatsumi et al. | |
| 2009/0108939 A1 | 4/2009 | Oishi | |
| 2009/0195302 A1 * | 8/2009 | Lin et al. | 327/543 |
| 2009/0203347 A1 * | 8/2009 | Kaczman et al. | 455/326 |
| 2009/0315621 A1 | 12/2009 | Narathong et al. | |
| 2010/0321096 A1 * | 12/2010 | Sudjian | 327/530 |
| 2011/0025422 A1 | 2/2011 | Marra et al. | |
| 2011/0248697 A1 * | 10/2011 | Kajigaya et al. | 323/311 |

OTHER PUBLICATIONS

Partial International Search Report—PCT/US2013/066696—ISA/EPO—Feb. 7, 2014.

International Search Report and Written Opinion—PCT/US2013/066696—ISA/EPO—May 9, 2014.

* cited by examiner

THRESHOLD TRACKING BIAS VOLTAGE FOR MIXERS

BACKGROUND

I. Field

The present disclosure relates generally to electronics, and more specifically to techniques for generating bias voltage for transistors in mixers and other circuits.

II. Background

Transistors are active circuit components commonly used in various circuits such as mixers. A mixer is a circuit that receives an input signal at an input frequency and a local oscillator (LO) signal at an LO frequency, frequency converts the input signal with the LO signal, and provides an output signal at an output frequency, which is determined by the input frequency and the LO frequency. A mixer may be used to frequency downconvert an input radio frequency (RF) signal from RF to baseband. A mixer may also be used to frequency upconvert an input baseband signal from baseband to RF.

A mixer may be required to have good linearity, which may be quantified by second order input intercept point (IIP2), residual side band (RSB), etc. Good linearity may be challenging to obtain because the electrical characteristics of transistors in a mixer may vary due to various factors such as variations in integrated circuit (IC) process, temperature, etc.

DETAILED DESCRIPTION

The detailed description set forth below is intended as a description of exemplary designs of the present disclosure and is not intended to represent the only designs in which the present disclosure can be practiced. The term "exemplary" is used herein to mean "serving as an example, instance, or illustration." Any design described herein as "exemplary" is not necessarily to be construed as preferred or advantageous over other designs. The detailed description includes specific details for the purpose of providing a thorough understanding of the exemplary designs of the present disclosure. It will be apparent to those skilled in the art that the exemplary designs described herein may be practiced without these specific details. In some instances, well-known structures and devices are shown in block diagram form in order to avoid obscuring the novelty of the exemplary designs presented herein.

Bias voltage generators that can generate variable bias voltages for transistors in mixers and other circuits are disclosed herein. These bias voltage generators may be used for various electronic devices such as wireless communication devices (e.g., cellular phones, smartphones, etc.) tablets, personal digital assistants (PDAs), handheld devices, wireless modems, laptop computers, smartbooks, netbooks, cordless phones, wireless local loop (WLL) stations, Bluetooth devices, consumer electronic devices, etc. For clarity, the use of bias voltage generators for a wireless communication device is described below.

Figure 1:
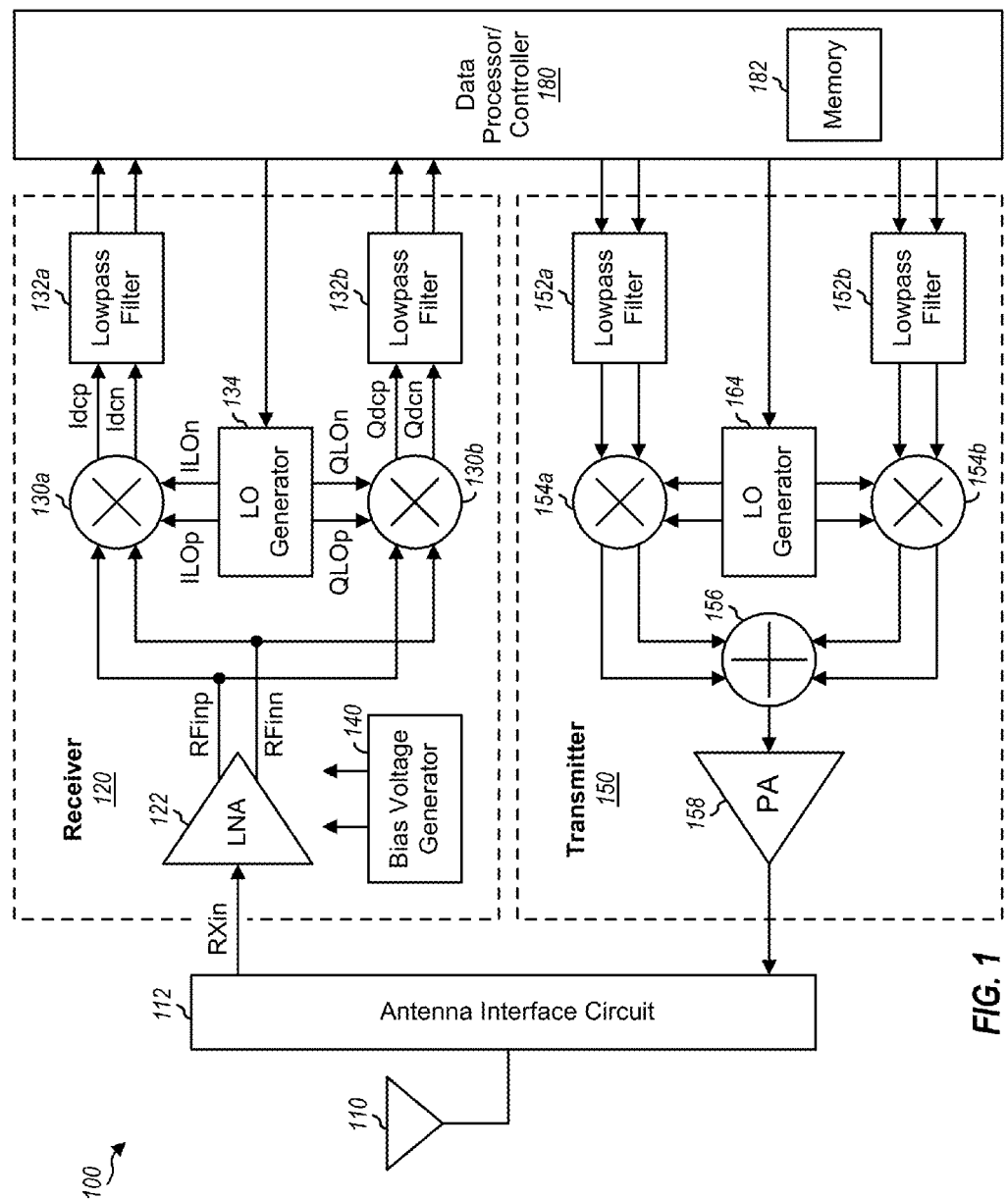
FIG. 1 shows a block diagram of a wireless communication device.

FIG. 1 shows a block diagram of an exemplary design of a wireless communication device 100, which may be a cellular phone, a smartphone, a tablet, etc. Wireless device 100 may support one or more radio technologies for wireless communication such as Long Term Evolution (LTE), Code Division Multiple Access (CDMA) 1X, Wideband CDMA (WCDMA), Global System for Mobile Communications (GSM), IEEE 802.11, etc. For simplicity, FIG. 1 shows wireless device 100 including one receiver 120 and one transmitter 150 for one antenna 110. In general, wireless device 100 may include any number of transmitters, any number of receivers, and any number of antennas to support communication for any number of radio technologies and any number of frequency bands.

A receiver or a transmitter may be implemented with a super-heterodyne architecture or a direct-conversion architecture. In the super-heterodyne architecture, a signal is frequency converted between RF and baseband in multiple stages, e.g., from RF to an intermediate frequency (IF) in one stage, and then from IF to baseband in another stage for a receiver. In the direct-conversion architecture, which is also referred to as a zero-IF (ZIF) architecture, a signal is frequency converted between RF and baseband in one stage. The super-heterodyne and direct-conversion architectures may use different circuit blocks and/or have different requirements. In the exemplary design shown in FIG. 1, receiver 120 and transmitter 150 are implemented with the direct-conversion architecture.

In the receive path, antenna 110 receives downlink signals from base stations and/or other transmitter stations and provides an antenna output signal to an antenna interface circuit 112. Circuit 112 routes the antenna output signal and provides a received RF signal (RXin) to receiver 120. Circuit 112 may include switches, duplexers, diplexer, filters, matching circuits, etc.

Within receiver 120, a low noise amplifier (LNA) 122 amplifies the received RF signal and provides an input RF signal (RFin) to mixers 130a and 130b. Mixer 130a downconverts the input RF signal with an inphase (I) LO signal (ILO) from an LO generator 134 and provides an I downconverted signal (Idc). A lowpass filter 132a filters the Idc signal and provides an I input baseband signal to a data processor/controller 180. Similarly, mixer 130b downconverts the input RF signal with a quadrature (Q) LO signal (QLO) from LO generator 134 and provides a Q downconverted signal (Qdc). A lowpass filter 132b filters the Qdc signal and provides a Q input baseband signal to data processor 180. Processor 180 digitizes and processes the I and Q input baseband signals to recover data sent to wireless device 100. Some signals within receiver 120 may be differential signals comprising non-inverting ("p") and inverting ("n") signals.

LO generator 134 generates the I and Q LO signals for mixers 130a and 130b. LO generator 134 may include one or more voltage controlled oscillators (VCOs), phase locked loops (PLLs), reference oscillators, dividers, buffers, etc. A bias voltage generator 140 generates bias voltages for switching transistors within mixers 130a and 130b.

In the transmit path, data processor 180 processes data to be transmitted and provides I and Q output baseband signals to transmitter 150. Within transmitter 150, the I and Q output baseband signals are filtered by lowpass filters 152a and 152b, upconverted by mixers 154a and 154b, summed by a summer 156, and amplified by a power amplifier (PA) 158 to generate an output RF signal having the desired output power level. The output RF signal is routed through antenna interface circuit 112 and transmitted via antenna 110. An LO generator 164 generates I and Q LO signals for mixers 154a and 154b, respectively.

FIG. 1 shows an exemplary design of receiver 120 and transmitter 150. In general, the conditioning of signals in a receiver or a transmitter may be performed by than or more amplifiers, filters, mixers, etc. These circuits may be arranged differently from the configuration shown in FIG. 1. Furthermore, a receiver and/or a transmitter may include other circuits not shown in FIG. 1, such as matching circuits. All or a portion of receiver 120 and transmitter 150 may be implemented on one or more RF integrated circuits (RFICs), analog ICs, mixed-signal ICs, etc. For example, LNA 122, mixers 130, and bias voltage generator 140 may be implemented on an RFIC.

Data processor/controller 180 may perform various functions for wireless device 100. For example, data processor 180 may perform processing for data being received via receiver 120 and data being transmitted via transmitter 150. Controller 180 may control the operation of receiver 120 and transmitter 150. A memory 182 may store program codes and data for data processor/controller 180. Data processor/controller 180 may be implemented on one or more application specific integrated circuits (ASICs) and/or other ICs.

The circuits within wireless device 100 may be implemented in various manners. Furthermore, the circuits may be implemented with N-channel metal oxide semiconductor (NMOS) transistors, P-channel metal oxide semiconductor (PMOS) transistors, and/or transistors of other types.

Figure 2:
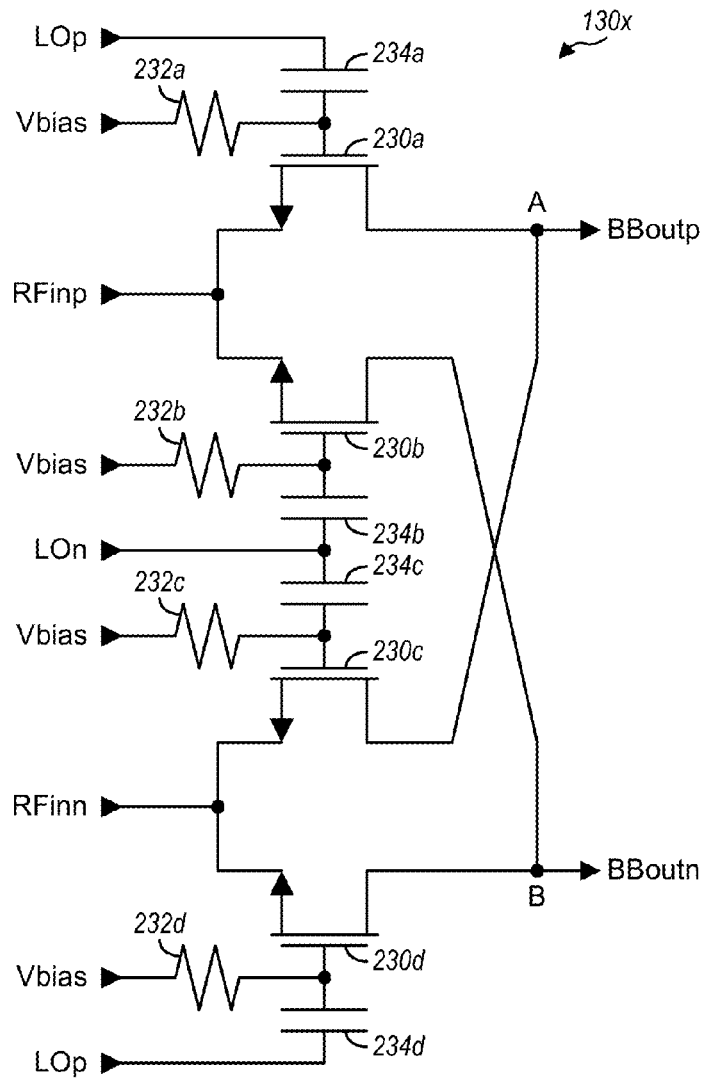
FIG. 2 shows a schematic diagram of a mixer.

FIG. 2 shows a schematic diagram of an exemplary design of a double-balanced passive mixer 130x implemented with NMOS transistors. Mixer 130x may be used for each of mixers 130a, 130b, 154a and 154b in FIG. 1. In the exemplary design shown in FIG. 2, mixer 130x includes two pairs of NMOS transistors that are cross-coupled together. NMOS transistors 230a and 230b have their sources coupled together and their drains coupled to node A and node B, respectively. Similarly, NMOS transistors 230c and 230d have their sources coupled together and their drains coupled to node A and node B, respectively. Each NMOS transistor 230 has its gate coupled to a first end of a respective resistor 232 and also to a first end of a respective AC coupling capacitor 234. A bias voltage (Vbias) is provided to a second end of resistors 232a to 232d.

A non-inverting LO signal (LOp) is applied to a second end of AC coupling capacitors 234a and 234d. An inverting LO signal (LOn) is applied to a second end of AC coupling capacitors 234b and 234c. A non-inverting input RF signal (RFinp) is applied to the sources of NMOS transistors 230a and 230b. An inverting input RF signal (RFinn) is applied to the sources of NMOS transistors 230c and 230d. A non-inverting downconverted signal (BBoutp) is provided by the drains of NMOS transistors 230a and 230c at node A. An inverting downconverted signal (BBoutn) is provided by the drains of NMOS transistors 230b and 230d at node B.

NMOS transistors 230a to 230d operate as switching transistors that can be turned on to steer current from their sources to their drains. For each pair of NMOS transistors 230, only one NMOS transistor is turned on and the other NMOS transistor is turned off at any given moment. The two NMOS transistors 230 in each pair are alternately turned on to steer the RFin signal to node A and node B. NMOS transistors 230 may be biased with the Vbias voltages at their gates. The Vbias voltages may be close to a threshold voltage (Vt) of NMOS transistors 230. A threshold voltage is a gate voltage at which a MOS transistor starts to turn on and may also be referred to as an "on" voltage. The threshold voltage of a MOS transistor typically varies with IC process.

Figure 3:
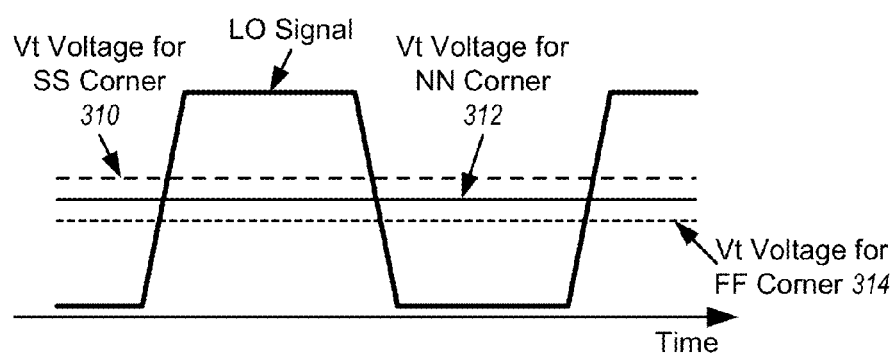
FIG. 3 shows threshold voltage of a transistor for different IC process corners.

FIG. 3 shows the threshold voltage of an NMOS transistor for different IC process corners. Variations in IC process may be quantified by three IC process corners of fast/fast (FF) corner for fast NMOS and fast PMOS, nominal/nominal (NN) corner for nominal NMOS and nominal PMOS, and slow/slow (SS) corner for slow NMOS and slow PMOS. The FF corner and the SS corner represent two extreme IC process conditions, and the NN corner represents nominal or expected IC process conditions. The NMOS transistor has a first threshold voltage for SS corner (which is shown by a line 310), a second threshold voltage for NN corner (which is shown by a line 312), and a third threshold voltage for FF corner (which is shown by a line 314).

FIG. 3 also shows an LO signal applied to the gate of the NMOS transistor. The LO signal has a leading edge for rising transition from low to high and a trailing edge for falling transition from high to low. The LO signal is applied to the gate of the NMOS transistor via an AC coupling capacitor (e.g., capacitor 234). The voltage at the gate of the NMOS transistor is equal to the LO signal plus a bias voltage.

Ideally, the bias voltage of the NMOS transistor should be close to a threshold voltage above the source voltage of the NMOS transistor for good switching performance, or Vbias≈Vt+Vs. If a fixed bias voltage is applied to the NMOS transistor but the threshold voltage of the NMOS transistor is dependent on IC process, then the NMOS transistor may be biased with a sub-optimal voltage. For example, the NMOS transistor may be biased with a bias voltage of Vt1 corresponding to the threshold voltage of the NMOS transistor for the NN corner. However, this bias voltage would be (i) too low if the NMOS transistor was fabricated with the SS corner or (ii) too high if the NMOS transistor was fabricated with the FF corner. In general, if the NMOS transistor is biased with a fixed voltage, then a difference of Vbias−Vt would be dependent on IC process and may result in a large variation of mixer performance versus IC process. Mixer performance may be quantified by IIP2, RSB, etc.

Several schemes may be used to obtain good performance for a mixer over IC process. In one scheme, LO circuitry may be designed for the worst IC process corner (e.g., for SS corner) so that it can provide an LO signal with rising and falling transitions that are sufficiently sharp in order to mitigate the impact of different threshold voltages for different IC process corners. However, the LO circuitry would utilize large transistors and would consume more battery power, which are undesirable. In another scheme, factory calibration may be performed to calibrate each device (e.g., each IC chip or each wireless device). The factory calibration may determine the IC process corner observed by each device and/or the performance of the device and may select an appropriate bias voltage for the device. However, factory calibration would require extra test equipment and add test time during device testing, which are undesirable.

In an aspect of the present disclosure, a bias voltage generator may generate a variable bias voltage based on IC process observed by switching transistors in a mixer (e.g., NMOS transistors 230 in mixer 130x in FIG. 2). The bias voltage may then track the threshold voltage of the switching transistors and may be applied to the switching transistors. The variable bias voltage may be generated based on IC process in various manners. In one exemplary design, the variable bias voltage may be generated by (i) implementing a replica transistor that tracks the switching transistors, (ii) applying a desired bias current through the replica transistor, (iii) generating a bias voltage for the replica transistor such that it conducts the desired bias current, and (iv) using the bias voltage of the replica transistor for the switching transistors. The bias voltage of the replica transistor is dependent on the threshold voltage of the replica transistor, which in turn is dependent on the IC process observed by the replica transistor as well as the switching transistors. Hence, the bias voltage of the replica transistor would track the threshold voltage of the switching transistors.

Figure 4:
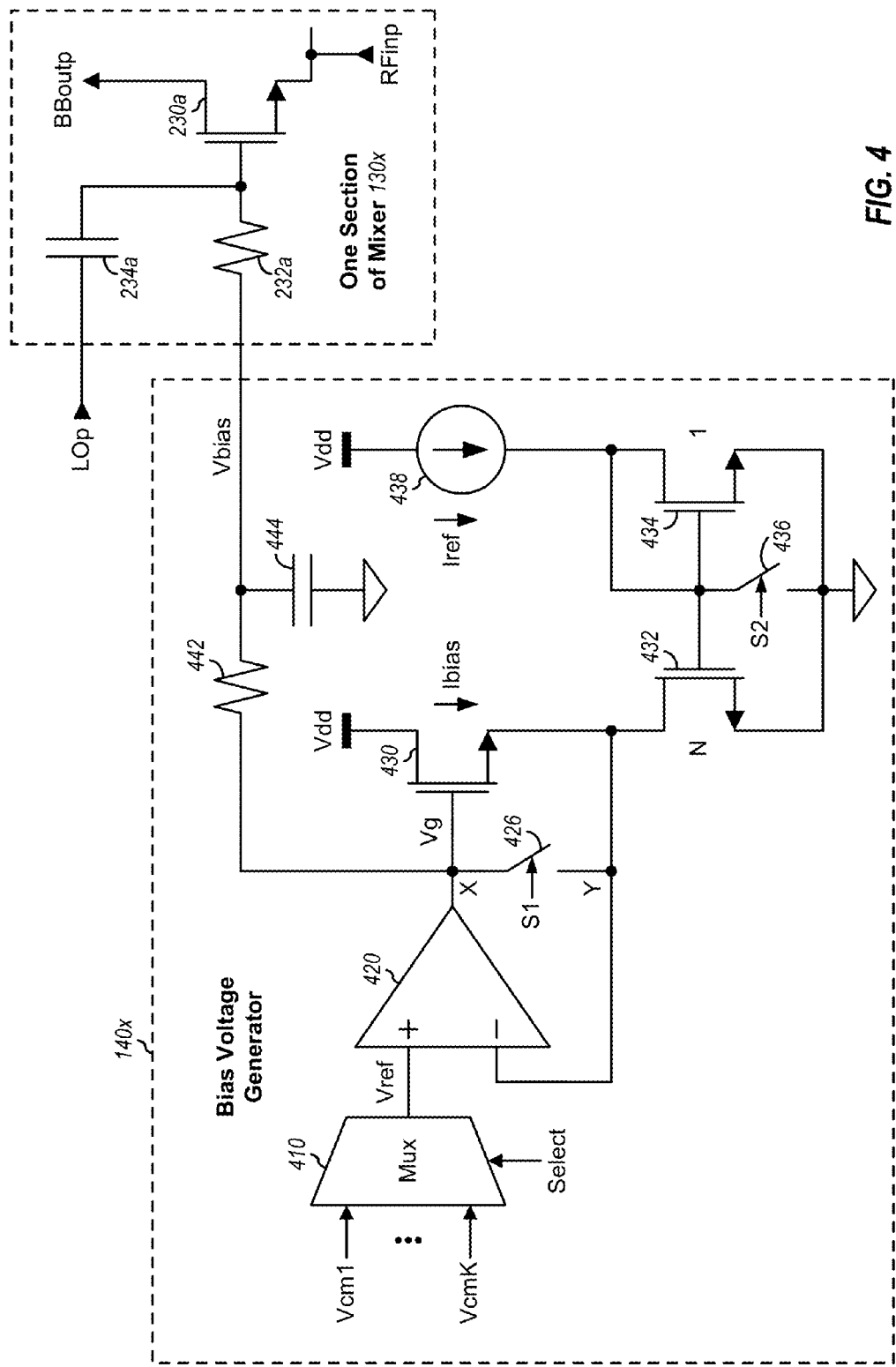
FIG. 4 shows a schematic diagram of a bias voltage generator.

FIG. 4 shows a schematic diagram of an exemplary design of a bias voltage generator 140x, which may be used for bias voltage generator 140 in FIG. 1. Generator 140x supports two operating modes. In a Vt tracking mode, generator 140x generates a bias voltage (Vbias) that is dependent on a threshold voltage of a NMOS transistor and a reference voltage (Vref). In a fixed mode, generator 140x generates a bias voltage that is dependent on the reference voltage but not the threshold voltage.

Within generator 140x, a multiplexer (Mux) 410 receives K voltages Vcm1 to VcmK and provides one of the K voltages as the Vref voltage, where K may be any integer value. The K voltages may be used for different IC process corners and/or for other purposes. The K voltages may be referred to as common mode voltages, fixed voltages, etc.

An operational amplifier (op-amp) 420 has its non-inverting input coupled to the output of multiplexer 410, its inverting input coupled to node Y, and its output coupled to node X. An NMOS transistor 430 has its source coupled to node Y, its gate coupled to node X, and its drain coupled to a power supply (Vdd). A switch 426 is coupled between node X and node Y. NMOS transistors 432 and 434 have their gates coupled together and their sources coupled to circuit ground. The drain of NMOS transistor 432 is coupled to node Y. The gate and drain of NMOS transistor 434 are coupled together. A current source 438 has one end coupled to Vdd and the other end coupled to the drain of NMOS transistor 434. A switch 436 is coupled between the gate of NMOS transistor 432 and circuit ground. A resistor 442 is coupled between node X and the output of generator 140x. A capacitor 444 is coupled between the output of generator 140x and circuit ground.

Generator 140x may operate in the Vt tracking mode or the fixed mode at any given moment. Generator 140x generates the bias voltage as Vbias≈Vref+Vt in the Vt tracking mode and as Vbias≈Vref in the fixed mode. Generator 140x may be controlled to operate in the Vt tracking mode by opening switches 426 and 436 or to operate in the fixed mode by closing switches 426 and 436.

Generator 140x operates in the Vt tracking mode as follows. Current source 438 provides a reference current (Iref), which may be a fixed current, or a PTAT (proportional to absolute temperature) current, or some other type of current. NMOS transistors 432 and 434 are coupled as a current mirror, with NMOS transistor 432 being N times the size of NMOS transistor 434, where N may be any suitable value. Hence, the bias current (Ibias) through NMOS transistor 432 is N times the Iref current through NMOS transistor 434. NMOS transistor 430 is a replica transistor that closely tracks NMOS transistors in a mixer (e.g., NMOS transistors 230a to 230d in mixer 130x in FIG. 2). For example, NMOS transistor 434 may have the same size, the same width to length ratio (W/L), and/or the same layout as each NMOS transistor 230 in mixer 130x. Hence, the threshold voltage of NMOS transistor 430 should closely match the threshold voltage of the NMOS transistors in the mixer. NMOS transistor 430 and op-amp 420 are coupled in a close loop. Op-amp 420 provides a gate voltage (Vg) to NMOS transistor 430 such that (i) the voltage at the source of NMOS transistor 430 (which is node Y) is equal to Vref and (ii) the Ibias current flows through NMOS transistor 430. The gate voltage of NMOS transistor 430 is approximately equal to the Vref voltage plus the threshold voltage of NMOS transistor 430. Resistor 442 and capacitor 444 form a lowpass filter that filters the Vg voltage and provides the Vbias voltage, which may be expressed as:

$$Vbias \approx Vref + Vt. \quad \text{Eq (1)}$$

As shown in equation (1), in the Vt tracking mode, generator 140x provides the Vbias voltage that tracks the threshold voltage of NMOS transistor 430. Since the Vt voltage is dependent on IC process and temperature, the Vbias voltage can track the Vt voltage over IC process and temperature. The Vbias voltage may track the threshold voltage better when the Iref current is a PTAT current, as described below.

Generator 140x operates in the fixed mode as follows. NMOS transistor 430 is turned off by closing switch 426, and NMOS transistors 432 and 434 are turned off by closing switch 436. Op-amp 420 operates as a unity gain amplifier and provides a Vg voltage that is equal to the Vref voltage. Resistor 442 and capacitor 444 filter the Vg voltage and provides the Vbias voltage, which may be expressed as:

$$Vbias \approx Vref. \quad \text{Eq (2)}$$

As shown in equation (2), in the fixed mode, generator 140x provides the Vbias voltage that is dependent on the Vref voltage but not on the threshold voltage of NMOS transistor 430. The Vref voltage may be one of the K voltages provided to multiplexer 410.

Figure 5:
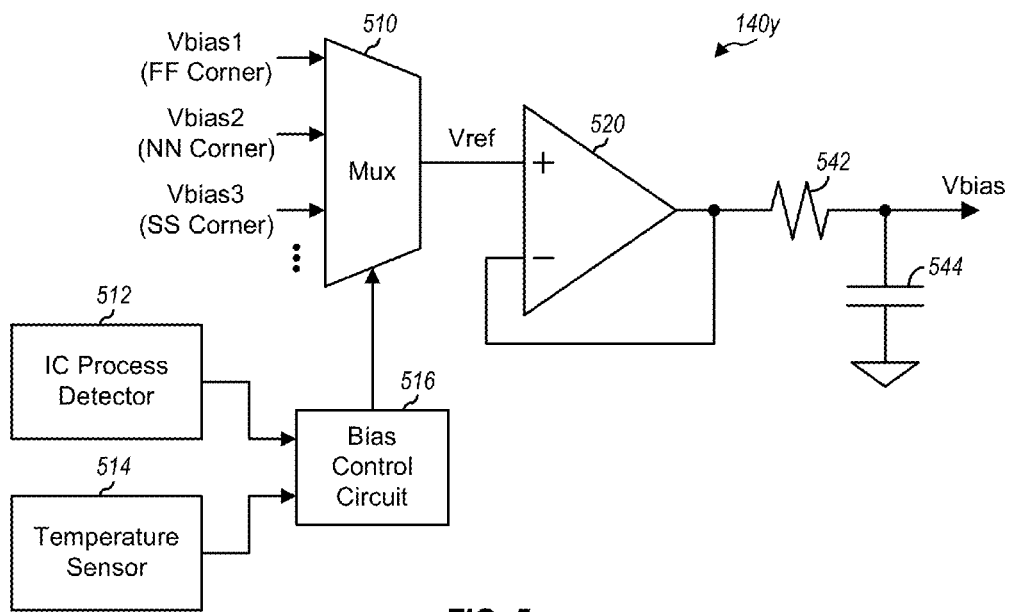
FIG. 5 shows a schematic diagram of another bias voltage generator.

FIG. 5 shows a schematic diagram of an exemplary design of a bias voltage generator 140y, which may also be used for bias voltage generator 140 in FIG. 1. Within generator 140y, a multiplexer 510 receives K bias voltages Vbias1 to VbiasK and provides one of the K bias voltages as the Vref voltage. The K bias voltages may provide good performance for different scenarios and may be determined based on computer simulation, lab measurement, etc. For example, Vbias1 may provide good mixer performance for FF corner (e.g., Vbias1≈1.1V), Vbias2 may provide good performance for NN corner (e.g., Vbias2≈1.2V), Vbias3 may provide good performance for SS corner (e.g., Vbias3≈1.3V), etc.

An IC process detector 512 detects the IC process conditions observed by switching transistors in mixers and provides the detected IC process conditions. A temperature sensor 514 senses the temperature experienced by the switching transistors and provides the sensed temperature. A bias control circuit 516 receives the detected IC process conditions and the sensed temperature and selects one of the K bias voltages based on the inputs. Control circuit 516 generates a control for multiplexer 510 to provide the selected bias voltage.

Detector 512 and sensor 514 may be implemented in various manners known in the art. For example, detector 512 may comprise a ring oscillator implemented with a number of inverters coupled in a loop, with each inverter being implemented with transistors. The frequency of the ring oscillator may be indicative of the IC process conditions observed by the transistors in the ring oscillator. Sensor 514 may comprise a transistor having a voltage or current that is dependent on temperature. The temperature-dependent voltage or current may be measured to determine the temperature observed by the transistor.

An op-amp 520 operates as a unity gain buffer and has its non-inverting input coupled to the output of multiplexer 510 and its inverting input coupled to its output. A resistor 542 is coupled between the output of op-amp 520 and the output of generator 140y. A capacitor 544 is coupled between the output of generator 140y and circuit ground. Op-amp 520 provides an output voltage that is approximately equal to Vref. Resistor 542 and capacitor 544 filter the output voltage and provides the Vbias voltage, which may be expressed as shown in equation (2).

In an exemplary design, a hybrid biasing scheme may be employed to (i) generate a variable bias voltage with Vt tracking under some conditions (e.g., for one or more IC process corners) and (ii) generate a fixed bias voltage under other conditions (e.g., for one or more other IC process corners). For a given condition (e.g., a given IC process corner), mixer performance may be determined for a first case with a variable bias voltage with Vt tracking and also for a second case with a fixed bias voltage. The bias voltage that can provide better mixer performance may be selected for use for that given condition.

Computer simulation based on a specific modeling was performed to measure IIP2 of a large number of mixers under different IC process corners. The computer simulation indicates that a bias voltage generated based on Vt tracking may provide higher IIP2 (which is better) for the NN corner and SS corner. The computer simulation also indicates that a fixed bias voltage generated without Vt tracking may provide higher IIP2 for the FF corner than a variable bias voltage generated with Vt tracking. This result was obtained for the specific modeling used in the simulation. The reason for this result may be due to the variable bias voltage with Vt tracking being lower for the FF corner, which may adversely impact IIP2. The lower IIP2 obtained for the FF corner with the variable bias voltage may not limit the performance of a mixer. Nevertheless, higher IIP2 may be obtained for the FF corner by using a fixed bias voltage instead of a variable bias voltage.

Figure 6:
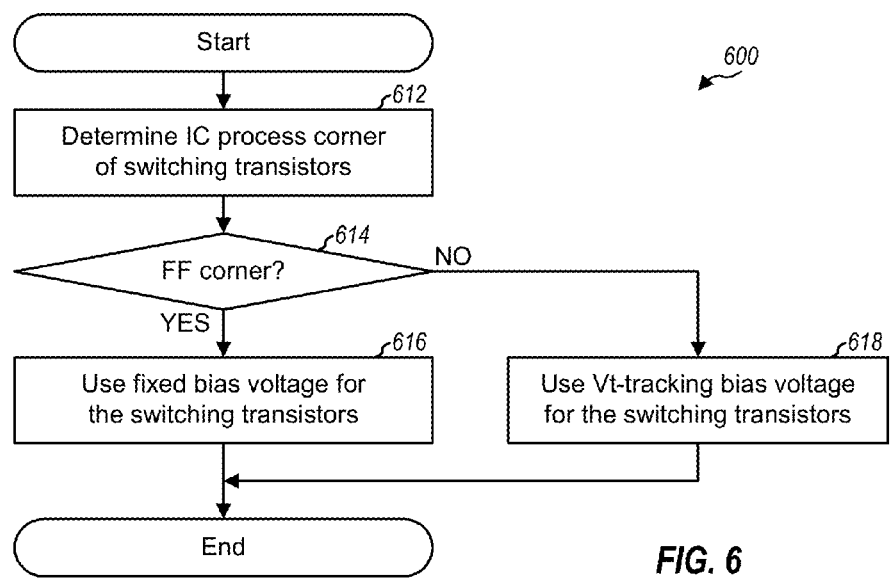
FIG. 6 shows a process for generating a bias voltage based on IC process corner.

FIG. 6 shows an exemplary design of a process 600 for generating a bias voltage in different manners based on detected IC process corner. The IC process corner of switching transistors in a mixer may be determined, e.g., using IC process detector 512 in FIG. 5 (block 612). A determination may be made whether the switching transistors are fabricated with FF corner (block 614). If the answer is 'Yes' for block 614, then a fixed bias voltage may be generated for the switching transistors in the mixer (block 616). Otherwise, if the answer is 'No' for block 614, then a Vt-tracking bias voltage may be generated for the switching transistors in the mixer (block 618).

FIG. 6 shows an exemplary design of the hybrid biasing scheme. In general, a variable bias voltage with Vt tracking or a fixed bias voltage may be selected for each IC process corner. A variable bias voltage with Vt tracking or a fixed bias voltage may also be selected based on other criteria such as temperature, power supply voltage, frequency of operation, etc.

Figure 7:
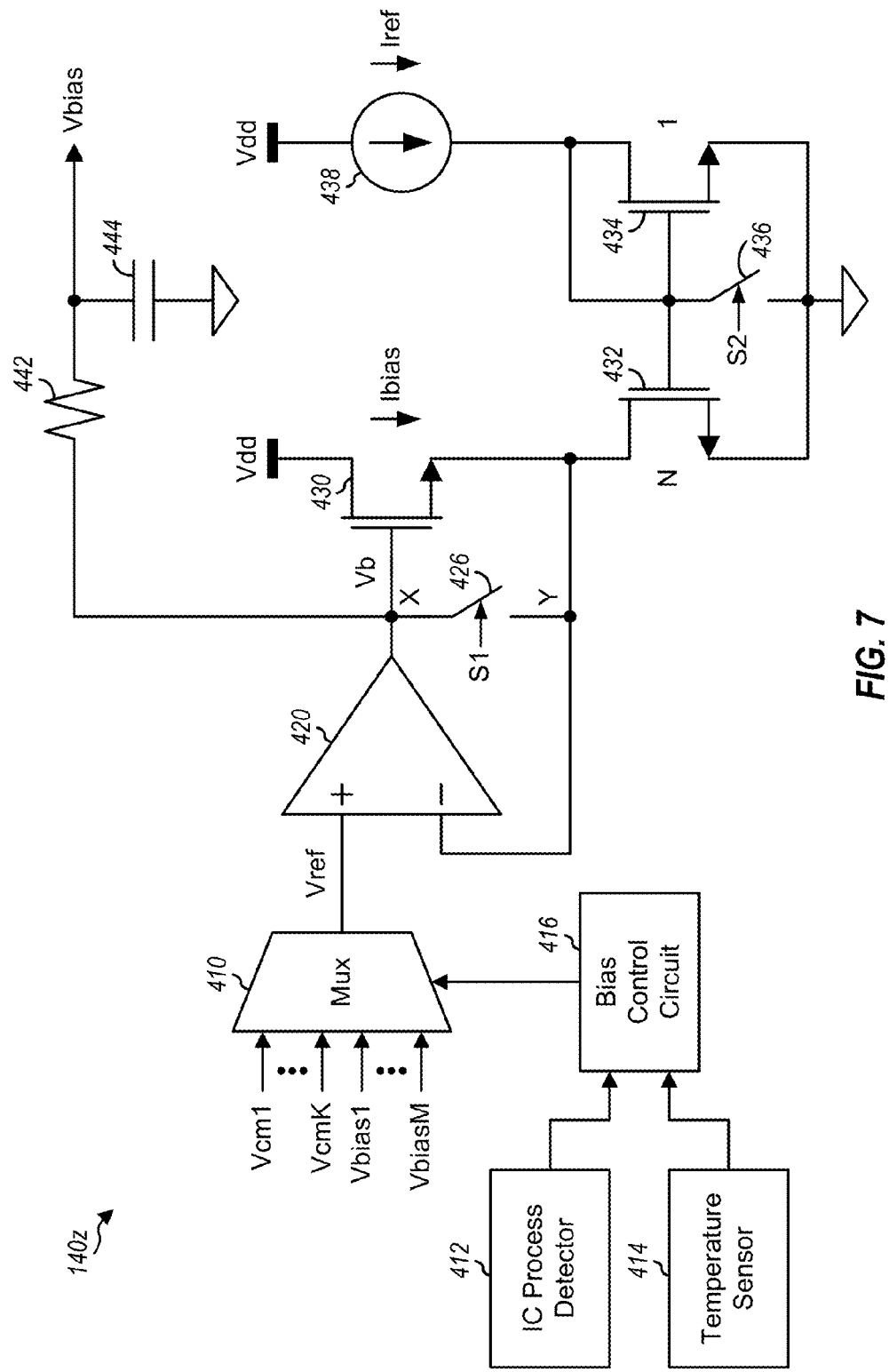
FIG. 7 shows a schematic diagram of yet another bias voltage generator.

FIG. 7 shows a schematic diagram of an exemplary design of a bias voltage generator 140z, which may also be used for bias voltage generator 140 in FIG. 1. Generator 140z includes all of the circuit components in generator 140x in FIG. 4. Generator 140z further includes an IC process detector 412, a temperature sensor 414, and a bias control circuit 416, which may operate in similar manner as detector 512, sensor 514, and bias control circuit 516 in FIG. 5. Control circuit 416 may receive the detected IC process corner from detector 412 and may selecting an operating mode for generator 140z. In an exemplary design, control circuit 416 may control generator 140z to operate in (i) the fixed mode when the FF corner is detected or (ii) the Vt tracking mode when the FF corner is not detected. Control circuit 416 may generate control signals S1 and S2 for switches 426 and 436 based on the selected operating mode. Control circuit 416 may also generate a select signal for multiplexer 410 to provide a selected voltage for a detected IC process corner as the Vref voltage.

Generator 140z may implement the exemplary design shown in FIG. 6. When the FF corner is detected, control circuit 416 may select the fixed mode for detector 140z. Control circuit 416 may also select one of the Vbias1 to VbiasM voltages, which may be approximately equal to a desired bias voltage for the FF corner. Op-amp 420 may provide the selected voltage as the Vbias voltage, e.g., as shown in equation (2). When the NN corner or the SS corner is detected, control circuit 416 may select the Vt tracking mode for detector 140z. Control circuit 416 may also select one of the Vcm1 to VcmK voltages for the detected IC process corner. Op-amp 420 may provide the selected voltage plus the Vt voltage as the Vbias voltage, e.g., as shown in equation (1).

For clarity, variation in Vt voltage versus IC process corners has been described above. The Vt voltage also varies with temperature.

Figure 8A:
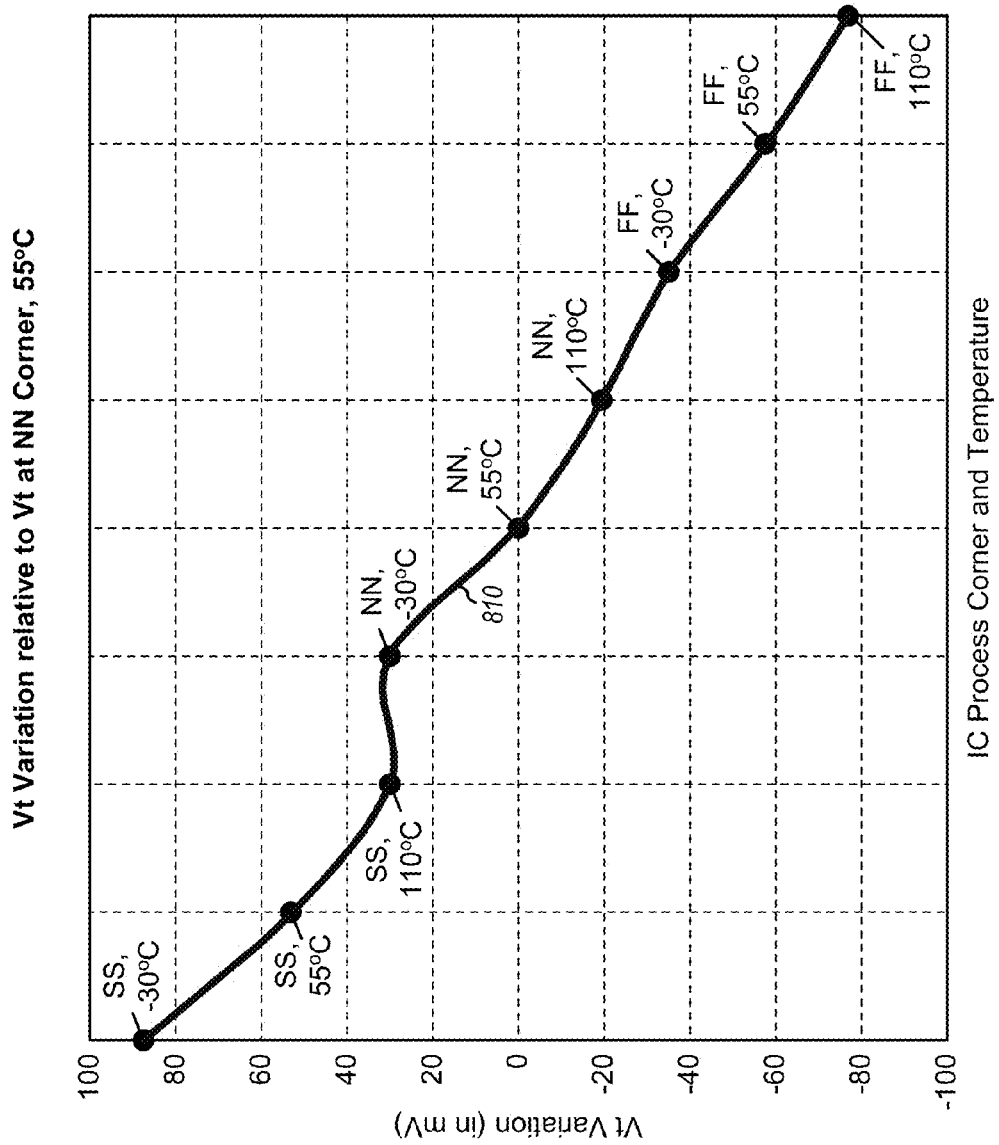
FIG. 8A shows a plot of threshold voltage for different IC process corners and temperature.

FIG. 8A shows a plot 810 of variation in Vt voltage for different IC process corners and temperature. Vt voltage is determined for each IC process corner at three temperatures of $-30°$ C., $55°$ C. and $110°$ C. (Celsius). The difference between the Vt voltage for each IC process corner at each temperature and the Vt voltage for the NN corner at $55°$ C. is computed and plotted in FIG. 8A. As shown in FIG. 8A, the Vt voltage for the SS corner is higher than the Vt voltage for the NN corner, which is higher than the Vt voltage for the FF corner. Furthermore, the Vt voltage for each IC process corner decreases for progressively higher temperature.

It may be desirable to generate the Vbias voltage for switching transistors such that the Vbias voltage tracks the Vt voltage of the switching transistors as closely as possible over IC process and temperature. This may provide good performance across IC process and temperature.

Figure 8B:
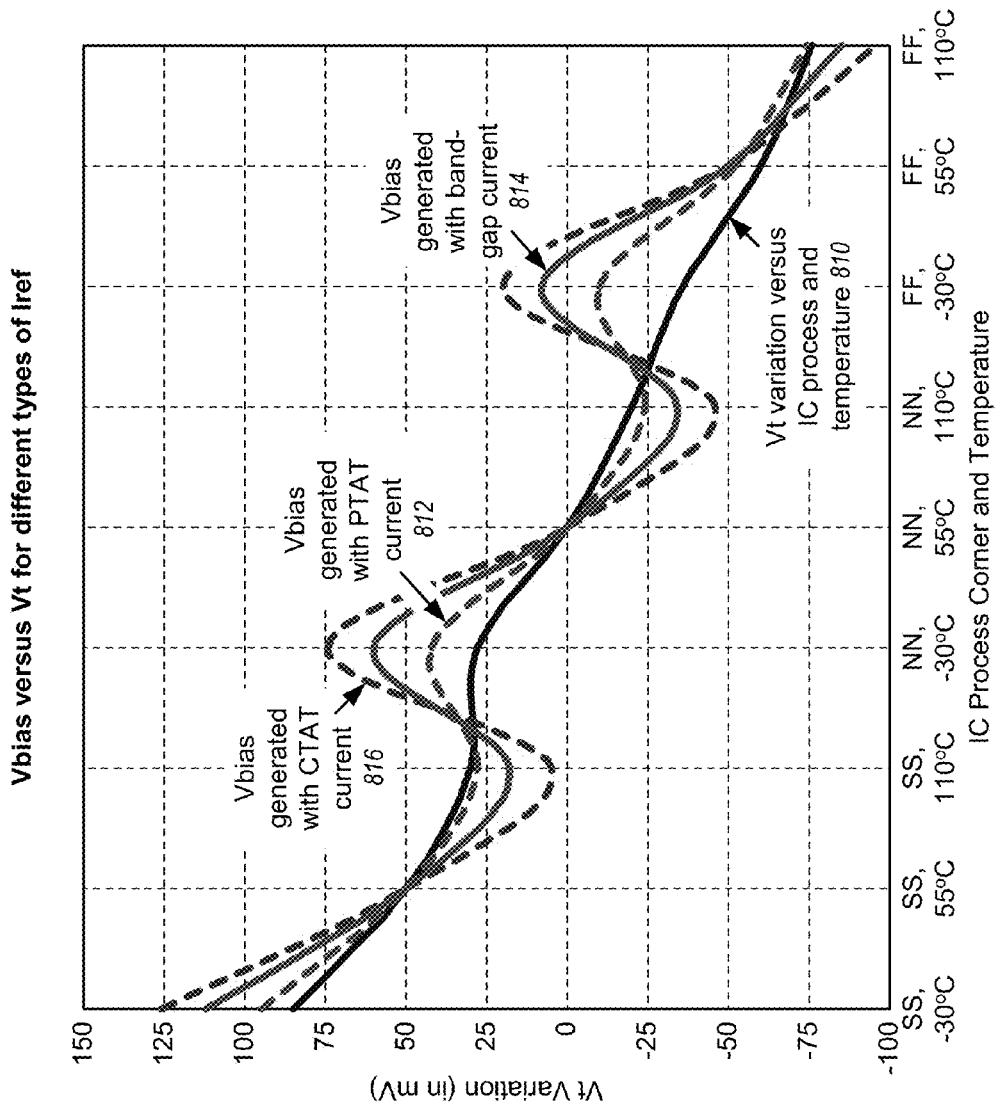
FIG. 8B shows plots of bias voltage generated based on different types of reference current.

FIG. 8B shows plots of Vbias voltage generated based on different types of Iref current. Plot 810 shows Vt voltage versus IC process and temperature and is the same as plot 810 in FIG. 8A. Plot 812 shows Vbias voltage generated by generator 140x in FIG. 4 or generator 140z in FIG. 7 with Iref current being a PTAT (proportional to absolute temperature) current. A PTAT current is a current that increases linearly with temperature. Plot 814 shows Vbias voltage generated by generator 140x or 140z with Iref current being a bandgap current. A bandgap current is a current that does not change with temperature. Plot 816 shows Vbias voltage generated by generator 140x or 140z with Iref current being a CTAT (complementary to absolute temperature) current. A CTAT current is a current that decreases linearly with temperature, which is opposite of a PTAT current.

As shown in FIG. 8B, Vbias voltage generated based on a PTAT current most closely tracks Vt voltage across IC process and temperature. In general, the Iref current may be generated based on any combination of a bandgap current, a PTAT current, and a CTAT current, as follows:

$$Iref = K1*Ibg + K2*Iptat + K3*Ictat, \qquad \text{Eq (3)}$$

where Ibg is a bandgap current, Iptat is a PTAT current, Ictat is a CTAT current, and K1, K2 and K3 are coefficients for the bandgap current, the PTAT current, and the CTAT current, respectively.

Coefficients K1, K2 and K3 may be selected to obtain a good match between the Vbias voltage and the Vt voltage. The Iref current may be generated based solely on a PTAT current by setting K2 to a non-zero value and setting K1 and K2 to zero. The Iref current may be generated based on a PTAT current as well as a bandgap current and/or a CTAT current in order to obtain a better match between the Vbias voltage and the Vt voltage, e.g., for the FF corner at high temperature. Coefficients K1, K2 and K3 may have fixed values or programmable values.

The techniques described herein for generating a bias voltage for switching transistors in a mixer to account for IC process and temperature may provide various advantages. First, the techniques may improve the performance of the mixer, e.g., improve IIP2 and RSB of the mixer. Second, the techniques may save circuit area by obviating the need to over-design LO circuitry for the worst IC process corner. Third, the techniques may save battery power consumption by not over-designing LO circuitry for the worst IC process corner. Fourth, the techniques may avoid the need for factory calibration to set the bias voltage of the switching transistors.

In an exemplary design, an apparatus (e.g., a wireless device, an IC, a circuit module, etc.) may include at least one transistor and a bias voltage generator. The at least one transistor may have a threshold voltage and may receive a bias voltage. The bias voltage generator may generate the bias voltage based on changes to the threshold voltage of the at least one transistor, e.g., due to IC process and/or temperature.

In an exemplary design, the at least one transistor may comprise a plurality of transistors in a mixer. The mixer may be used for frequency downconversion in a receiver or frequency upconversion in a transmitter. In an exemplary design, the at least one transistor may comprise a plurality of NMOS transistors (e.g., NMOS transistor 230a to 230d in FIG. 2) in a mixer used for frequency downconversion. The at least one transistor may also comprise transistors of other types and/or may be used in other circuits.

In an exemplary design, the bias voltage generator may include a replica transistor and an op-amp. The replica transistor (e.g., replica NMOS transistor 430 in FIG. 4) may track the at least one transistor. The op-amp (e.g., op-amp 420) may be operatively (e.g., directly or indirectly) coupled to the replica transistor and may provide a gate voltage for the replica transistor. The bias voltage for the at least one transistor may be generated based on (e.g., by filtering) the gate voltage for the replicate transistor. The bias voltage generator may further include a current source and a current mirror. The current source (e.g., current source 438) may provide a reference current, which may be generated based on a PTAT current, or a bandgap current, or a CTAT current, or a combination thereof. The current mirror (e.g., NMOS transistors 432 and 434) may receive the reference current and provide a bias current for the replica transistor.

In an exemplary design, the bias voltage generator may operate in one of a plurality of modes including a first mode and a second mode. The bias voltage generator may generate the bias voltage to track the threshold voltage of the at least one transistor in the first mode (e.g., the Vt tracking mode). The bias voltage generator may generate the bias voltage based on a fixed voltage in the second mode (e.g., the fixed mode). The first mode may be selected for a first IC process corner, e.g., an SS corner. The second mode may be selected for a second IC process corner, e.g., an FF corner. The first or second mode may also be selected in other manners, e.g., based on other factors such as temperature, power supply voltage, frequency of operation, etc. The bias voltage generator may include switches (e.g., switches 426 and 436) to configure it to operate in a selected mode.

In another exemplary design, the bias voltage generator may include a multiplexer (e.g., multiplexer 510 in FIG. 5 or multiplexer 410 in FIG. 7). The multiplexer may receive a plurality of voltages and provide a selected voltage among the plurality of voltages. The bias voltage for the at least one transistor may be generated based on the selected voltage. The bias voltage generator may further include an IC process detector that may determine an IC process corner applicable for the at least one transistor. The plurality of voltages may correspond to target bias voltages for a plurality of IC process corners. The selected voltage may be associated with the determined IC process corner. Alternatively or additionally, the bias voltage generator may include a temperature sensor that may sense the temperature of the at least one transistor. The selected voltage may be selected based on the sensed temperature.

Figure 9:
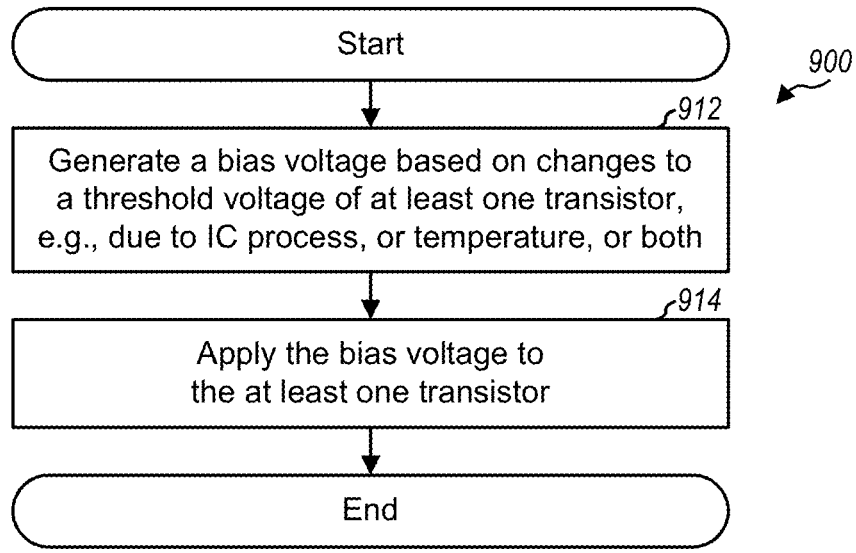
FIGS. 9 and 10 show processes for generating a bias voltage for transistors.

FIG. 9 shows an exemplary design of a process 900 for generating a bias voltage for transistors. A bias voltage may be generated based on changes to a threshold voltage of at least one transistor, e.g., due to IC process and/or temperature (block 912). The at least one transistor may comprise a plurality of transistors in a mixer or transistors in other circuits. The bias voltage may be applied to the at least one transistor (block 914).

Figure 10:
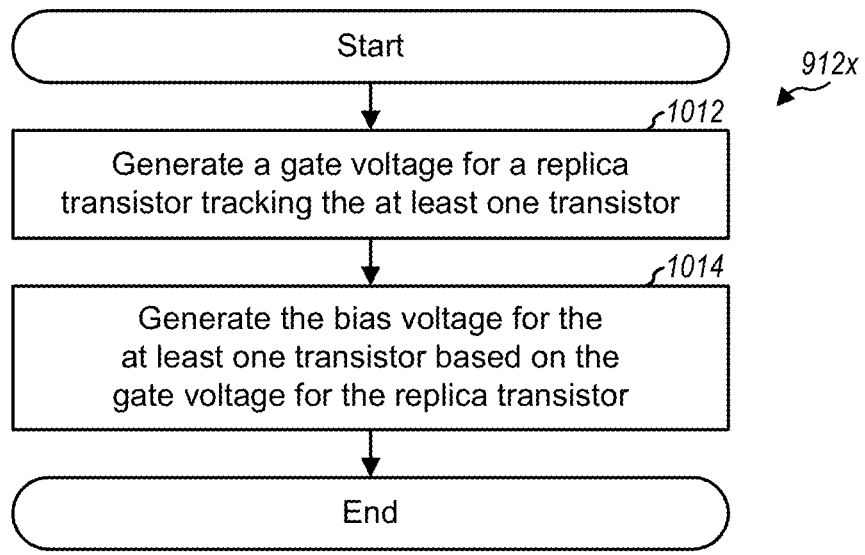

FIG. 10 shows an exemplary design of a process 912x for generating a bias voltage using a replica transistor. Process 912x may be used for block 912 in FIG. 9. A gate voltage for a replica transistor that tracks the at least one transistor may be generated (block 1012). The bias voltage for the at least one transistor may then be generated based on the gate voltage for the replica transistor (block 1014).

In an exemplary design shown in FIG. 6, the bias voltage may be generated to track the threshold voltage of the at least one transistor for an SS corner. The bias voltage may be generated based on a fixed voltage for an FF corner.

In another exemplary design of block 912, one of a plurality of voltages may be selected based on a detected IC process corner for the at least one transistor. The plurality of voltages may be associated with different IC process corners. The bias voltage for the at least one transistor may be generated based on the selected voltage.

The bias voltage generators described herein may be implemented on an IC, an analog IC, an RFIC, a mixed-signal IC, an application specific integrated circuit (ASIC), a printed circuit board (PCB), an electronic device, etc. The bias voltage generators may also be fabricated with various IC process technologies such as complementary metal oxide semiconductor (CMOS), N-channel MOS (NMOS), P-channel MOS (PMOS), bipolar junction transistor (BJT), bipolar-CMOS (BiCMOS), silicon germanium (SiGe), gallium arsenide (GaAs), heterojunction bipolar transistors (HBTs), high electron mobility transistors (HEMTs), silicon-on-insulator (SOI), etc.

An apparatus implementing any of the bias voltage generators described herein may be a stand-alone device or may be part of a larger device. A device may be (i) a stand-alone IC, (ii) a set of one or more ICs that may include memory ICs for storing data and/or instructions, (iii) an RFIC such as an RF receiver (RFR) or an RF transmitter/receiver (RTR), (iv) an ASIC such as a mobile station modem (MSM), (v) a module that may be embedded within other devices, (vi) a receiver, cellular phone, wireless device, handset, or mobile unit, (vii) etc.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the scope of the disclosure. Thus, the disclosure is not intended to be limited to the examples and designs described herein but is to be accorded the widest scope consistent with the principles and novel features disclosed herein.

What is claimed is:

1. An apparatus comprising:
   at least one transistor configured for mixing an RF input signal with a local oscillator (LO), the at least one transistor further configured to receive a bias voltage for biasing the LO coupled to the at least one transistor; and
   a bias voltage generator configured to generate the bias voltage for biasing the LO based on changes to a threshold voltage caused by an integrated circuit (IC) process corner of the at least one transistor, the changes determined by a replica transistor tracking the at least one transistor, the bias voltage generator further configured to select the bias voltage from among one of a variable voltage tracking the threshold voltage and a fixed voltage, the selection of the one determined by the IC process corner and the selection of the fixed voltage turning off the replica transistor.

2. The apparatus of claim 1, the bias voltage generator comprising:
   an operational amplifier (op-amp) operatively coupled to the replica transistor and configured to provide a gate voltage for the replica transistor, the bias voltage for the at least one transistor being generated based on the gate voltage for the replica transistor.

3. The apparatus of claim 2, the bias voltage generator further comprising:
   a current source configured to provide a reference current; and
   a current mirror configured to receive the reference current and provide a bias current for the replica transistor.

4. The apparatus of claim 1, the bias voltage generator configured to operate in one of a plurality of modes including a first mode and a second mode, to generate the bias voltage to track the threshold voltage of the at least one transistor in the first mode, and to generate the bias voltage based on a fixed voltage in the second mode.

5. The apparatus of claim 4, the first mode being selected for a first integrated circuit (IC) process corner, and the second mode being selected for a second IC process corner.

6. The apparatus of claim 1, the bias voltage generator configured to generate the bias voltage based on at least one of a bandgap current, a PTAT (proportional to absolute temperature) current, or a CTAT (complementary to absolute temperature) current.

7. The apparatus of claim 1, the bias voltage generator comprising:
   a multiplexer configured to receive a plurality of voltages and provide a selected voltage among the plurality of voltages, the bias voltage for the at least one transistor being generated based on the selected voltage.

8. The apparatus of claim 7, the plurality of voltages corresponding to target bias voltages for a plurality of integrated circuit (IC) process corners.

9. The apparatus of claim 7, the bias voltage generator further comprising:
   an integrated circuit (IC) process detector configured to determine an IC process corner applicable for the at least one transistor, the selected voltage being associated with the determined IC process corner.

10. The apparatus of claim 7, the bias voltage generator further comprising:
    a temperature sensor configured to sense a temperature of the at least one transistor, the selected voltage being selected based on the sensed temperature.

11. The apparatus of claim 1, the at least one transistor comprising a plurality of transistors in a mixer.

12. The apparatus of claim 1, the at least one transistor comprising a plurality of N-channel metal oxide semiconductor (NMOS) transistors in a mixer used for frequency down conversion.

13. A method comprising:
    generating a bias voltage for biasing a local oscillator (LO) based on changes to a threshold voltage caused by an integrated circuit (IC) process corner of at least one transistor, the changes determined by a replica transistor tracking the at least one transistor;
    applying the bias voltage to the at least one transistor configured for mixing an RF input signal with the LO, the at least one transistor further configured to receive the bias voltage for biasing the LO coupled to the at least one transistor; and
    selecting the bias voltage for biasing the LO from among one of a variable voltage tracking the threshold voltage and a fixed voltage, the selection of the one determined by the IC process corner and the selection of the fixed voltage turning off the replica transistor.

14. The method of claim 13, the generating the bias voltage comprising:
    generating a gate voltage for the replica transistor tracking the at least one transistor; and generating the bias voltage for the at least one transistor based on the gate voltage for the replica transistor.

15. The method of claim 13, the generating the bias voltage comprising:
generating the bias voltage to track the threshold voltage of the at least one transistor for a first integrated circuit (IC) process corner; and
generating the bias voltage based on a fixed voltage for a second IC process corner.

16. The method of claim 13, the generating the bias voltage comprising:
selecting one of a plurality of voltages based on a detected integrated circuit (IC) process corner for the at least one transistor, the plurality of voltages being associated with different IC process corners; and
generating the bias voltage for the at least one transistor based on the selected voltage.

17. An apparatus comprising:
means for generating a bias voltage for biasing a local oscillator (LO) based on changes to a threshold voltage caused by an integrated circuit (IC) process corner of at least one transistor, the changes determined by a replica transistor tracking the at least one transistor;
means for applying the bias voltage to the at least one transistor configured for mixing an RF input signal with the LO, the at least one transistor further configured to receive the bias voltage for biasing the LO coupled to the at least one transistor; and
means for selecting the bias voltage for biasing the LO from among one of a variable voltage tracking the threshold voltage and a fixed voltage, the selection of the one determined by the IC process corner and the selection of the fixed voltage turning off the replica transistor.

18. The apparatus of claim 17, the means for generating the bias voltage comprising:
means for generating a gate voltage for the replica transistor tracking the at least one transistor; and
means for generating the bias voltage for the at least one transistor based on the gate voltage for the replica transistor.

19. The apparatus of claim 17, the means for generating the bias voltage comprising:
means for generating the bias voltage to track the threshold voltage of the at least one transistor for a first integrated circuit (IC) process corner; and
means for generating the bias voltage based on a fixed voltage for a second IC process corner.

20. The apparatus of claim 17, the means for generating the bias voltage comprising:
means for selecting one of a plurality of voltages based on a detected integrated circuit (IC) process corner for the at least one transistor, the plurality of voltages being associated with different IC process corners; and
means for generating the bias voltage for the at least one transistor based on the selected voltage.

* * * * *